(12) United States Patent
Herrmann et al.

(10) Patent No.: US 10,062,813 B2
(45) Date of Patent: Aug. 28, 2018

(54) OPTOELECTRONIC DEVICE AND METHOD FOR PRODUCING AN OPTOELECTRONIC DEVICE

(71) Applicant: OSRAM Opto Semiconductors GmbH, Regensburg (DE)

(72) Inventors: Siegfried Herrmann, Neukirchen (DE); Matthias Sperl, Mintraching (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/306,441

(22) PCT Filed: Apr. 24, 2015

(86) PCT No.: PCT/EP2015/058874
§ 371 (c)(1),
(2) Date: Oct. 24, 2016

(87) PCT Pub. No.: WO2015/162236
PCT Pub. Date: Oct. 29, 2015

(65) Prior Publication Data
US 2017/0047486 A1    Feb. 16, 2017

(30) Foreign Application Priority Data

Apr. 25, 2014    (DE) .................. 10 2014 105 839

(51) Int. Cl.
*H01L 33/48*    (2010.01)
*F21V 8/00*    (2006.01)
(Continued)

(52) U.S. Cl.
CPC .......... *H01L 33/486* (2013.01); *G02B 6/0073* (2013.01); *H01L 27/0248* (2013.01);
(Continued)

(58) Field of Classification Search
CPC .................. H01L 33/486; H01L 2924/181
See application file for complete search history.

(56) References Cited

U.S. PATENT DOCUMENTS 6,337,874 B1* 1/2002 Yang .................... G02B 6/4216
                                              372/102
2005/0093146 A1* 5/2005 Sakano .................. H01L 33/62
                                              257/730
(Continued)

FOREIGN PATENT DOCUMENTS

DE        102008012316 A1    4/2009
JP        2013-225597 A     10/2013

*Primary Examiner* — Lex Malsawma
*Assistant Examiner* — Xia Cross
(74) *Attorney, Agent, or Firm* — McDermott Will & Emery LLP

(57) ABSTRACT

An optoelectronic component (100) comprises an optoelectronic semiconductor chip (10), a first contact area (31) and a second contact area (32), which is laterally offset with respect to the first contact area and is electrically insulated therefrom, and a housing element (40). The first contact area (31) is electrically conductively connected to the first semiconductor layer (21) and the second contact area (32) is electrically conductively connected to the second semiconductor layer (22) of the optoelectronic semiconductor chip. The first contact area (31) and the second contact area (32) project beyond the optoelectronic semiconductor chip laterally in each case. The housing element (40) is fixed to the first contact area (31) and the second contact area (32) in regions in which the first contact area (31) and the second contact area (32) project beyond the optoelectronic semiconductor chip laterally in each case. The housing element surrounds the optoelectronic semiconductor chip at least partly. A surface of the housing element that faces the
(Continued)

optoelectronic semiconductor chip is embodied as reflective at least in partial regions. A wall of the housing element has a cutout (61).

12 Claims, 6 Drawing Sheets

(51) Int. Cl.
    *H01L 33/58* (2010.01)
    *H01L 33/60* (2010.01)
    *H01L 27/02* (2006.01)
    *H01L 31/02* (2006.01)
    *H01L 31/0203* (2014.01)
    *H01L 31/0232* (2014.01)
    *H01L 31/0304* (2006.01)
    *H01L 31/0352* (2006.01)
    *H01L 31/18* (2006.01)
    *H01L 33/00* (2010.01)
    *H01L 33/06* (2010.01)
    *H01L 33/30* (2010.01)
    *H01L 33/32* (2010.01)
    *H01L 33/50* (2010.01)
    *H01L 33/62* (2010.01)

(52) U.S. Cl.
    CPC .... *H01L 31/0203* (2013.01); *H01L 31/02005* (2013.01); *H01L 31/02322* (2013.01); *H01L 31/02327* (2013.01); *H01L 31/03046* (2013.01); *H01L 31/03048* (2013.01); *H01L 31/035236* (2013.01); *H01L 31/186* (2013.01); *H01L 33/0095* (2013.01); *H01L 33/06* (2013.01); *H01L 33/30* (2013.01); *H01L 33/32* (2013.01); *H01L 33/502* (2013.01); *H01L 33/58* (2013.01); *H01L 33/60* (2013.01); *H01L 33/62* (2013.01); *H01L 2924/181* (2013.01); *H01L 2933/0033* (2013.01); *H01L 2933/0066* (2013.01); *H01L 2933/0091* (2013.01)

(56) References Cited

U.S. PATENT DOCUMENTS

| | | |
|---|---|---|
| 2007/0284600 A1 | 12/2007 | Shchekin et al. |
| 2008/0308824 A1 | 12/2008 | Shchekin et al. |
| 2009/0045420 A1 | 2/2009 | Eng et al. |
| 2009/0086508 A1 | 4/2009 | Bierhuizen |
| 2010/0258830 A1 | 10/2010 | Ide et al. |
| 2011/0032710 A1 | 2/2011 | Higashi et al. |
| 2011/0051043 A1* | 3/2011 | Kim ............... G02B 6/0068 349/64 |
| 2012/0094405 A1 | 4/2012 | Chiang et al. |
| 2012/0112226 A1* | 5/2012 | Grolier ............ H01L 33/382 257/98 |
| 2012/0280116 A1* | 11/2012 | Krauter ........... H01L 33/486 250/226 |
| 2012/0281417 A1 | 11/2012 | Sun et al. |
| 2012/0319292 A1 | 12/2012 | Ho et al. |
| 2013/0207144 A1* | 8/2013 | Ramchen .......... H01L 33/56 257/98 |
| 2013/0235611 A1 | 9/2013 | Franklin et al. |

* cited by examiner

OPTOELECTRONIC DEVICE AND METHOD FOR PRODUCING AN OPTOELECTRONIC DEVICE

The present application relates to an optoelectronic device and to a method for producing an optoelectronic device. It also defines a lighting unit and a back-lighting unit containing the optoelectronic device according to the invention.

This patent application claims priority from German patent application 102014105839.9, the disclosure of which is included by reference.

Back-lighting (or backlight) units are known from the prior art that have a low-profile design and in which a plurality of light-emitting diodes are mounted around the sides of a light guide. These are usually designed as side-emitting devices (known as side-lookers). The individual light-emitting diodes are soldered onto a suitable carrier, for instance onto a flex board or a printed circuit board, and form as a whole an LED light bar (also known as an LED light strip). The bar is positioned as close as possible to a light guide so that the light emitted by the light-emitting diodes can couple into the light guide.

The arrangements described are complex structures having a large number of components requiring complex interconnection. In addition, all the light sources must be positioned in the immediate vicinity of the light guide, which, for instance, is in the form of a planar light distribution plate.

One object is to define a lighting or back-lighting unit that comprises a small number of components. In particular it is the object to define an arrangement having a planar light distribution plate, for which the light source need not necessarily be positioned at the edge of the light distribution plate. It is also an object to define an optoelectronic device that has a very low-profile design and is part of the lighting or back-lighting unit according to the invention.

This object is achieved by an optoelectronic device and by a method for producing an optoelectronic device according to the independent claims. The subject matter of the dependent claims contains further embodiments and advantages.

According to at least one embodiment, the optoelectronic device comprises an optoelectronic semiconductor chip, a first contact surface, a second contact surface that is laterally offset and electrically isolated from said first contact surface, and a housing element. The optoelectronic semiconductor chip comprises a semiconductor body, which comprises a semiconductor layer sequence containing an active region provided for generating and/or receiving radiation. The active region is arranged between a first semiconductor layer and a second semiconductor layer. The first contact surface is connected to the first semiconductor layer in an electrically conducting manner. The second contact surface is correspondingly connected to the second semiconductor layer in an electrically conducting manner. In this arrangement, the first contact surface and the second contact surface each protrude laterally from the optoelectronic semiconductor chip. The housing element is attached to the first contact surface and to the second contact surface in regions in which the first contact surface and the second contact surface respectively protrude laterally from the optoelectronic semiconductor chip.

The housing element encloses at least part of the optoelectronic semiconductor chip. A surface of the housing element that faces the optoelectronic semiconductor chip is designed here to be reflective at least in portions. At least one wall of the housing element comprises an opening.

A lateral (side) direction is understood to mean in particular a direction parallel to a main extension plane of the contact surfaces and/or to at least one of the semiconductor layers of the semiconductor body. Similarly, a vertical direction is understood to mean in particular a direction perpendicular to a main extension plane of the contact surfaces and/or to at least one of the semiconductor layers of the semiconductor body.

A layer or an element being arranged or mounted "on" or "above" another layer or another element can mean here and below that the one layer or the one element is arranged immediately on the other layer or other element in direct mechanical and/or electrical contact. In addition it can also mean that the one layer or the one element is arranged indirectly on or above the other layer or other element. In this case, further layers and/or elements can then be arranged between the one layer and the other layer.

The opening in the wall of the housing element is designed in particular to accommodate a separate light guide element. In this case, the light guide element is preferably inserted through the opening into the optoelectronic device in such a way that it protrudes at least partially into the optoelectronic device. The radiation generated by the semiconductor chip can be coupled thereby into the light guide element. The optoelectronic device according to the invention is advantageously used in this arrangement as part of a lighting unit or of a back-lighting unit.

The housing element being attached to the two contact surfaces and thereby connecting said contact surfaces mechanically gives the required mechanical strength to the optoelectronic device as a whole. This ensures a construction that is mechanically sufficiently strong even for a low-profile design. In particular, the semiconductor chip, which is arranged inside the housing element, does not need to have a self-supporting design.

The feature of the housing element enclosing at least part of the optoelectronic semiconductor chip can mean in particular that the optoelectronic semiconductor chip is enclosed by the housing element from the sides and optionally also from a face of the semiconductor chip that faces away from the two contact surfaces, excluding the region in which the opening is arranged.

By designing an (internal) surface of the housing element that faces the optoelectronic semiconductor chip to be reflective at least in portions, a significant proportion or even most of the radiation emitted by the semiconductor chip can be coupled into a light guide element inserted in the device. Preferably more than 75%, more preferably more than 90%, of the surface that faces the optoelectronic semiconductor chip is designed to be reflective. By using a reflective internal surface of the housing element, a comparatively simple chip technology can be employed, and a "volume emitter" can be used as the semiconductor chip, for example, for which a substantial proportion of the radiation exits from the side faces of the semiconductor chip. In particular, a sapphire chip can be used, for which the growth substrate made of sapphire is left on the semiconductor layers. Hence unlike when fabricating thin-film LED chips, it is not necessary to remove the growth substrate from the semiconductor layers.

According to at least one embodiment of the device, at least part of the housing element is made of a reflective material or at least a portion of the surface of the housing element that faces the optoelectronic semiconductor chip is formed by a layer of reflective material. The housing element preferably comprises a metal or comprises a glass coated at least partially by a reflective material, or is made of one of these materials. If the semiconductor chip generates ultraviolet light, then using a metal or at least a metal coating provides an arrangement that is particularly resistant to radiation compared with housing elements known from the prior art made of plastics.

For a design of the housing element that is sufficiently strong mechanically, it is possible by using the described materials such as metal or glass, for instance, to make a particularly good mechanical bond between the optoelectronic device and the light guide element inserted therein.

According to another embodiment, the housing element contains a (preferably white) plastics material, for example an epoxy, in which preferably are embedded scattering particles of titanium dioxide, which have a scattering and/or reflective effect on the generated electromagnetic radiation, or is made of one of said materials. For example, the housing element can be produced in a molding process such as, for instance, an injection molding process, for example in a composite structure in which a multiplicity of identical housing elements are formed. For example, a multiplicity of semiconductor chips can be inserted in the housing elements (which preferably comprise suitable openings), for instance in a flip-chip configuration by means of known pick-and-place techniques. The contact surfaces can subsequently be formed by laminating or sputtering for instance.

Framing the sides of the semiconductor chip at least partially by the housing element allows additional elements to be integrated without impinging on parts of the interior of the device and hence on the radiation-emission region. This is achieved in a space-saving manner by arranging the additional elements within the housing element.

For instance a circuit for protecting the optoelectronic semiconductor chip from electrostatic discharge (ESD) can be arranged in a wall of the housing element, which circuit is connected to the two contact surfaces in an electrically conducting manner and, for example, is in the form of an ESD protection diode. In terms of the forward direction, the ESD protection diode can be arranged, for instance, antiparallel to the forward direction of a diode structure of the semiconductor body. In the event of electrostatic charge building up in the diode structure, charge carriers can be conducted away via the ESD protection diode embedded in the housing element.

The lateral protrusion of the two contact surfaces beyond the optoelectronic semiconductor chip preferably equals at least 50 µm, more preferably at least 100 µm. This ensures a sufficiently strong attachment of the housing element to the two contact surfaces.

According to at least one embodiment of the device, the opening is arranged in a side wall of the housing element or in an end-face wall of the housing element. An end-face wall is understood to mean here a wall that is arranged on an opposite face of the device from the contact surfaces. Depending on the geometric arrangement of the opening, a light guide element can be inserted into the device from the side or from a face of the device that faces away from the contact surfaces.

According to at least one embodiment of the device, the optoelectronic device has a height, i.e. a vertical dimension, of less than 500 µm, preferably less than 300 µm, more preferably less than 200 µm. This advantageously low-profile design is possible by virtue of the described mechanically strong construction. This is primarily achieved by the fact that the housing element largely encloses the semiconductor chip in particular from the sides. A low-profile design of this type is advantageous especially when light is coupled from the side into a light guide element arranged in an opening in a side wall of the housing element, because it is thereby possible to provide lighting units or back-lighting units that have a very low overall height.

According to at least one embodiment of the device, a thickness of a side wall of the housing element is less than 150 µm, preferably less than 100 µm. A lateral distance between the semiconductor chip and a side wall of the housing element preferably equals between 2 µm and 30 µm, preferably between 5 µm and 20 µm.

According to at least one embodiment of the device, the housing element comprises a frame element that at least partially encloses the optoelectronic semiconductor chip laterally. In particular, at least one piece of the frame element can fully enclose the optoelectronic semiconductor chip laterally. The frame element preferably comprises a metal or comprises a glass coated at least partially by a reflective material, or is made of one of these materials. In one embodiment, the frame element comprises the opening described above, through which a light guide element can be inserted into the device from the side. In one embodiment, the frame element exhibits singulation marks on its external side walls. It is also possible that the frame element is either merely part of the housing element or that the frame element forms the housing element, i.e. the housing element consists solely of the frame element. According to one embodiment, the frame element contains a plastics material, for example an epoxy, in which preferably are embedded scattering particles of titanium dioxide, which have a scattering and/or reflective effect on the generated electromagnetic radiation, or is made of one of said materials. For example, the frame element can be produced in a molding process such as, for instance, an injection molding process, in a composite structure, for example, in which a multiplicity of similar frame elements are formed. A multiplicity of semiconductor chips, for example, can be inserted in the frame elements (which preferably comprise suitable openings), for instance in a flip-chip configuration by means of known pick-and-place techniques. The contact surfaces can subsequently be formed by laminating or sputtering for instance. A bond between a frame element and a semiconductor chip inserted therein is made preferably by applying heat or by adding bonding materials such as an adhesive for instance.

According to at least one embodiment of the device, the housing element comprises a cover element that is arranged on an opposite face of the device from the two contact surfaces. The cover element preferably comprises or is made of a material designed to be reflective. In one embodiment, the cover element comprises the opening described above, through which a light guide element can be inserted on an end face of the device.

According to at least one embodiment of the device, the housing element is attached by means of an intermediate layer to the first contact surface and to the second contact surface. The intermediate layer is preferably made of an insulating and/or elastic material, for instance is made of an elastic plastics material.

According to at least one embodiment of the device, the optoelectronic device also comprises a conversion element. The conversion element is designed in particular to convert primary radiation of a first wavelength generated in the semiconductor chip into secondary radiation of a longer wavelength that differs from the first wavelength. For example, the optoelectronic device is intended to generate mixed light, in particular mixed light that appears white to the human eye, and to couple said light into a light guide element. Preferably at least part of the conversion element is arranged between the optoelectronic semiconductor chip and the opening.

According to at least one embodiment of the device, the semiconductor body comprises at least one recess, which extends through the second semiconductor layer and the active region into the first semiconductor layer, and which is filled at least partially with electrically conducting material, said first contact surface being connected to the first semiconductor layer through the recess in an electrically conducting manner.

According to at least one embodiment, a mirror layer is arranged between the two contact surfaces and the semiconductor body. The mirror layer is preferably connected in an electrically conducting manner to the second contact surface and hence also to the second semiconductor layer. According to at least one embodiment, the recess extends through the mirror layer. An insulating layer is preferably arranged between the mirror layer and the first contact surface. According to at least one embodiment, the optoelectronic device is designed to be a surface mounted device.

A lighting or back-lighting unit is also defined that comprises the optoelectronic device described above and at least one light guide element, at least part of which is arranged in the at least one opening in the optoelectronic device. The light guide element is preferably inserted in the opening such that at least a part thereof protrudes into the inside of the optoelectronic device. The light guide element may be, for example, a longitudinal light guide such as an optical fiber, or a planar light distribution plate made of glass or plastics.

In one embodiment, the lighting or back-lighting unit comprises a longitudinal light guide, at least part of which is arranged in the opening in the optoelectronic device. A region of the light guide located outside the optoelectronic device is arranged on an edge of a planar light distribution plate. By means of this arrangement, the light generated by the optoelectronic device is coupled into the light guide and therefrom into the light distribution plate.

The back-lighting unit can comprise retaining means for an element to be backlit. The element to be backlit may be a liquid crystal display for instance.

In one embodiment, the method for producing an optoelectronic device comprises the following method steps:

a) Providing a base layer and patterning said base layer so as to produce a multiplicity of first and second contact strips;

b) Providing a pattered additional layer, which comprises a multiplicity of openings, and attaching the patterned additional layer to the base layer;

c) Providing a multiplicity of optoelectronic semiconductor chips, each of which optoelectronic semiconductor chips has a semiconductor body that comprises a semiconductor layer sequence containing an active region that is provided for generating and/or receiving radiation and is arranged between a first semiconductor layer and a second semiconductor layer;

d) Mounting each of the optoelectronic semiconductor chips on the base layer through one each of the openings in the patterned additional layer, so that one of the first contact strips is connected to the first semiconductor layer in an electrically conducting manner, and one of the second contact strips is connected to the second semiconductor layer in an electrically conducting manner;

e) Forming a cover element in the region of each of the openings in the additional layer; and f) Singulating into a multiplicity of optoelectronic devices, each device comprising a semiconductor chip, a portion of the additional layer as frame element, a portion of one of the first contact strips as first contact surface, a portion of one of the second contact strips as second contact surface, and a cover element.

As a result of the singulation step, the frame element of each of the optoelectronic devices exhibits singulation marks on its external side walls.

The production method described above is suitable in particular for producing the described optoelectronic device. Features described in connection with the method can therefore also be applied to the semiconductor chip, and vice versa.

Further features, embodiments and advantages are given in the following description of the exemplified embodiments in conjunction with the figures, in which.

In the figures, the same reference numbers are used to denote identical, similar or equivalent elements.

The figures and the relative sizes of the elements illustrated in the figures shall not be considered to be to scale. Indeed individual elements, in particular layer thicknesses, may be shown exaggeratedly large in order to improve visualization and/or understanding.

Figure 1:
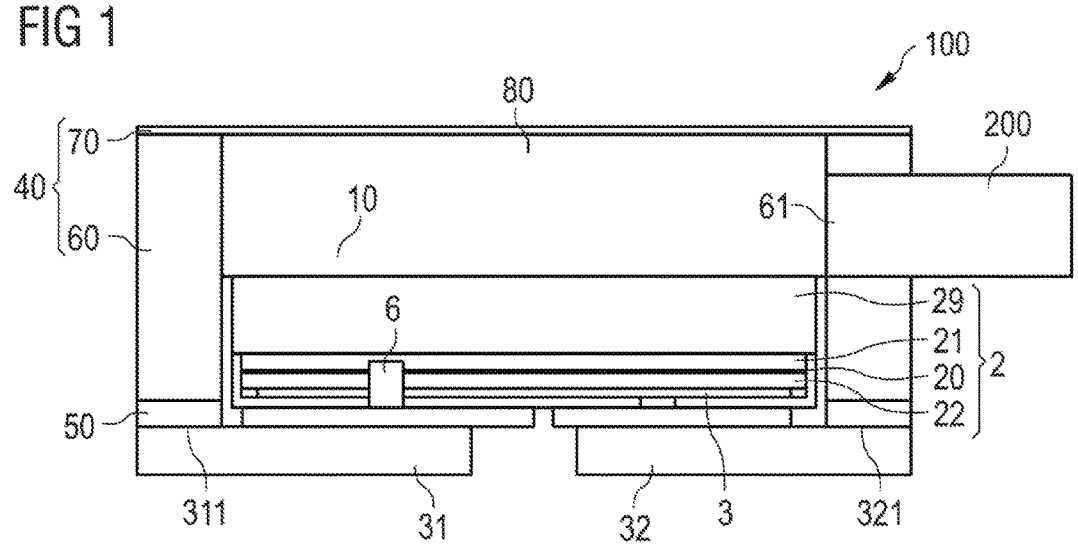
FIG. 1 shows an exemplified embodiment of an optoelectronic device in a schematic sectional view.

FIG. 1 shows a schematic sectional view of an optoelectronic device according to a first exemplified embodiment.

The optoelectronic device, which is denoted as a whole by 100, comprises an optoelectronic semiconductor chip 10, which is mounted on a first contact surface 31 and on a second contact surface 32, which is laterally offset therefrom, such that on applying a voltage between the first contact surface 31 and the second contact surface 32, light is generated by the optoelectronic semiconductor chip 10. An electrically insulating elastic intermediate layer (not shown), which comprises an epoxy for instance, is optionally arranged between the first contact surface 31 and the second contact surface 32. The semiconductor chip 10 is embodied as a light-emitting diode chip. Alternatively, it can be embodied as a semiconductor laser, in particular as a laser diode chip.

The semiconductor chip 10 is a sapphire chip, which is mounted in a flip-chip configuration. In an operational use of the device, the two contact surfaces 31, 32 are mounted, for instance soldered, on a printed circuit board in an electrically conducting manner.

In greater detail, the semiconductor chip 10 comprises a semiconductor body 2 having a growth substrate 29, on which a semiconductor layer sequence is deposited. The semiconductor layer sequence comprises a first semiconductor layer 21 that faces the growth substrate 29, an active region 20 and a second semiconductor layer 22 on a face of the active region that faces away from the first semiconductor layer 21. The first semiconductor layer 21 and the second semiconductor layer 22 differ from one another in terms of conductivity type. For instance, the first semiconductor layer 21 may be designed to be n-type and the second semiconductor layer to be p-type, or vice versa. The first semiconductor layer 21 and the second semiconductor layer 22 can each comprise a plurality of sublayers.

The semiconductor layer sequence 24, in particular the active region 20, preferably contains a III-V compound semiconductor material, in the present exemplified embodiment contains gallium nitride.

III-V compound semiconductor materials are particularly suitable for generating radiation in the ultraviolet spectral range ($Al_xIn_yGa_{1-x-y}N$) through the visible range ($Al_xIn_yGa_{1-x-y}N$, in particular for blue to green radiation, or $Al_xIn_yGa_{1-x-y}P$, in particular for yellow to red radiation) up to the infrared spectral range ($Al_xIn_yGa_{1-x-y}As$), where in each case $0 \leq x \leq 1$, $0 \leq y \leq 1$ and $x+y \leq 1$, in particular where $x \neq 1$, $y \neq 1$, $x \neq 0$ and/or $y \neq 0$. Furthermore, using III-V compound semiconductor materials, in particular those from the stated material systems, it is possible to achieve high internal quantum efficiencies in generating the radiation.

The active region 20 preferably comprises a pn-junction, a double heterostructure, a single quantum well (SQW) or, more preferably, a multi-quantum well (MQW) structure for the purpose of generating radiation. The term quantum well structure has no bearing here on the dimensionality of the quantization. Thus it includes, inter alia, not just quantum wells but also quantum wires and quantum dots and any combination of these structures.

A mirror layer 3 containing a metal or metal alloy is applied to the semiconductor layer sequence. The growth substrate 29 is made of sapphire in the present exemplified embodiment. The first contact surface 31 is connected to the first semiconductor layer 21 in an electrically conducting manner by a multiplicity of recesses 6 (of which only one is shown in FIG. 1), which extend through the mirror layer 3, the second semiconductor layer 22 and the active region 20 into the first semiconductor layer 21. The second contact surface 32 is connected to the second semiconductor layer 22 in an electrically conducting manner by means of the mirror layer 3. On a main face of the mirror layer 3 that faces away from the semiconductor layer sequence is arranged an isolation layer that isolates the mirror layer 3 from underlying elements.

The walls of the recesses 6 are lined by an insulating material, preferably by an isolation layer. In addition, the recesses 6 are filled at least partially with electrically conducting material, thereby making the electrically conducting connection between the first contact surface 31 and the first semiconductor layer 21.

The recesses 6 are advantageously distributed over the extent of the semiconductor body 2. They are advantageously distributed uniformly in a grid, for instance like points of a lattice. Charge carriers can thus reach the first semiconductor layer 21 locally via the recesses 6 in a lateral distribution over the semiconductor body 2. The semiconductor material of the first semiconductor layer 21 advantageously has a higher conductivity in the lateral direction, i.e. parallel to the active layer 20, than the material that is used for the second semiconductor layer 22. Despite contact being made with the first semiconductor layer 21 only at points via the recesses 6, a homogeneous current distribution in the lateral direction can hence be achieved by means of current spreading in the semiconductor body 2. An injection of charge carriers over a large area in the active region 20 can thus be achieved despite the local injection of charge carriers. For nitride compound semiconductor materials, the n-type material often has a considerably higher conductivity in the lateral direction than the p-type material, for instance p-GaN. The first semiconductor layer 21 is thus preferably designed to be n-type, and the second semiconductor layer 22 is designed to be p-type. In the present exemplified embodiment, the first semiconductor layer 21 is made of n-GaN, and the second semiconductor layer 22 is made of p-GaN.

As shown in FIG. 1, the first contact surface 31 and the second contact surface 32 each protrude in a lateral direction from the optoelectronic semiconductor chip. This produces regions 311, 321, which are left uncovered by the optoelectronic semiconductor chip 10. A frame element 60 is laminated onto these regions 311, 321 by means of an intermediate layer 50 made of an elastic plastics material. The frame element 60 encloses the semiconductor chip 10 in a lateral direction. On one of the side walls of the frame element 60 is provided an opening 61, which is designed to accommodate a light guide 200, which is longitudinal in shape in the present exemplified embodiment. On the opposite face of the device 100 from the two contact surfaces 31, 32 is arranged a cover element 70 made of reflective metal that closes the device from above. The frame element 60 and the cover element 70 together form a housing element 40 in the sense of the present invention.

Between the semiconductor chip 10 and the cover element 70 is arranged a conversion element 80, which directly adjoins the opening 61 and at least part of which is thereby arranged between the optoelectronic semiconductor chip and the opening.

The frame element 60 is made of a reflective metal in the exemplified embodiment shown. Thus the active layer of the semiconductor chip 10 is enclosed on every side by an element designed to be reflective (mirror layer 3, frame element 60 and cover element 70). The light generated by the sapphire chip 10 acting as a volume emitter can thus be coupled without losses into the light guide element 200 through the opening 61.

The intermediate layer 50 is made of an elastic plastics material, which is used not only for electrical insulation between the contact surfaces 31, 32 and the frame element 60, but can also absorb mechanical stresses that arise during fabrication of the device.

Alternatively, the frame element 60 can be made of glass that has a reflective coating, for instance of silver. In this case, the intermediate layer 50 can be designed to be either reflective or transparent. If the intermediate layer 50 has a transparent design, the contact surfaces 31, 32 are preferably made of a reflective metal or are themselves coated by a reflective layer, for instance of silver.

Figure 2:
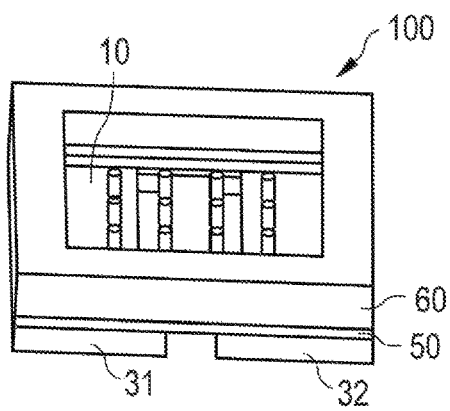
FIGS. 2 and 3 show the exemplified embodiment illustrated in FIG. 1 in different perspective views.
Figure 3:
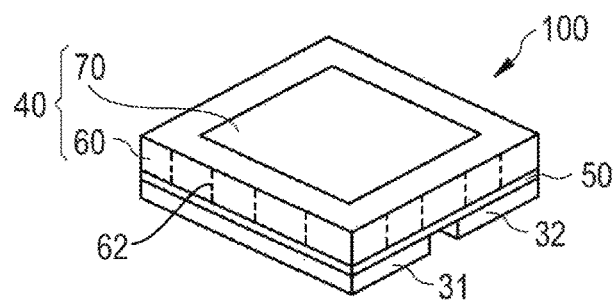

FIGS. 2 and 3 show the exemplified embodiment illustrated in FIG. 1 in different perspective views. The cover element 70 is omitted from FIG. 2 in order to show the inside of the device. The opening 61 is not shown in either FIG. 2 or FIG. 3.

The device 100 shown in FIG. 1 can be produced by arranging two suitably patterned metal foils vertically one above the other and bonding said foils by means of an adhesive layer, which is designed to be electrically insulating. The corresponding production method is not shown in detail in the figures.

To give more precise details of the production method, a base layer made of metal is patterned so as to produce a multiplicity of first and second contact strips, which subsequently form in the singulated devices the first and second contact surfaces. A patterned additional layer made of metal and comprising a multiplicity of openings is then laminated onto the base layer such that the openings are each arranged vertically above the gaps between the first and second contact strips.

The optoelectronic semiconductor chips are then mounted on the base layer such that the connection shown in FIG. 1 to the contact surfaces 31, 32 is made in the subsequently singulated devices. For this purpose, the semiconductor chips are mounted on the first and second contact strips through the openings in the additional layer. In addition are formed the additional elements shown in FIG. 1 such as the conversion element 80 and covering layer 70.

Finally, singulation into a multiplicity of the optoelectronic devices shown in FIG. 1 is performed. In the singulation process, the patterned additional layer is severed vertically such that each of the optoelectronic devices comprises one frame element 60, which exhibits singulation marks 62 (e.g., as shown in FIG. 3) on its external side walls as a result of the fabrication process.

Figure 4:
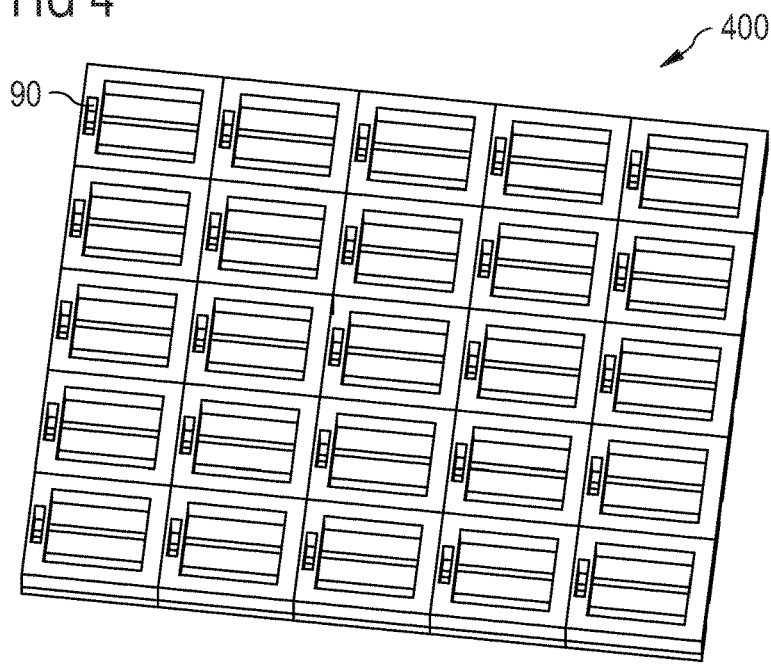
FIG. 4 shows a composite layer structure in a stage of the method for producing the optoelectronic device according to the invention.
Figure 5:
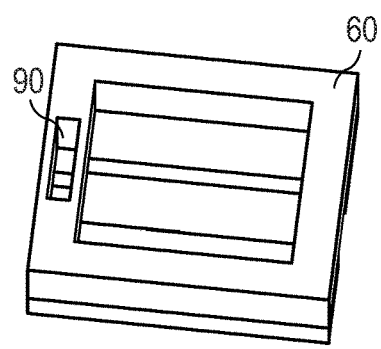
FIGS. 5 and 6 show parts of the composite structure illustrated in FIG. 4.
Figure 6:
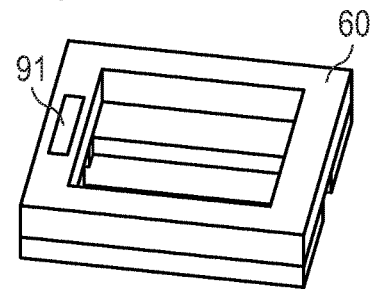

FIG. 4 shows a composite layer structure 400 in a stage of the described production method in which the semiconductor chips have not been inserted yet. FIGS. 5 and 6 show parts of the composite structure illustrated in FIG. 4. As shown in FIGS. 4 to 6, additional openings 90 can be formed in the subsequent frame elements of the optoelectronic devices, through each of which openings can be inserted an EDS protection diode 91. FIG. 6 shows an arrangement comprising a surface-mounted ESD protection diode 91.

Figure 7:
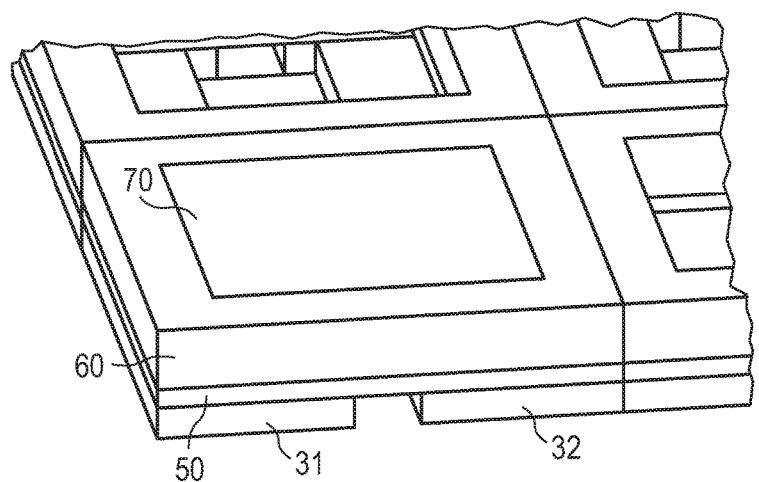
FIG. 7 shows a composite layer structure in a further stage of the method for producing the optoelectronic device according to the invention.

FIG. 7 shows a composite layer structure in a further stage of the method after the semiconductor chip has been inserted and the cover element 70 has been formed.

Figure 8:
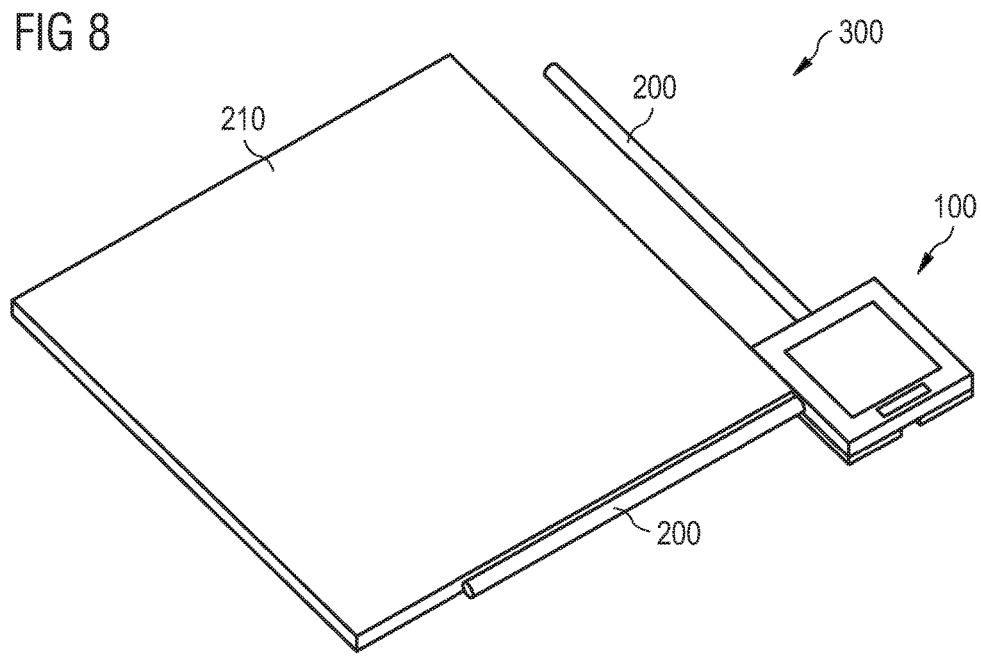
FIG. 8 shows an exemplified embodiment of a lighting unit or back-lighting unit.

FIG. 8 shows a back-lighting unit according to one embodiment of the invention. The back-lighting unit denoted as a whole by 300 comprises an optoelectronic device 100, which can be designed as shown in FIG. 1, and two longitudinal light guides 200, which each protrude into one of two openings 61 in the optoelectronic device 100. The light guides 200 are arranged at the edges of a light distribution plate 210 and couple light into this light distribution plate 210 that is emitted over the surface of said plate. In order to achieve efficient coupling, the light guides 200 are preferably micro-structured on the side that faces the light distribution plate 210, for instance structured by microscopic roughened areas.

A cross-section of the longitudinal light guide 200 is circular in the exemplified embodiment shown, but can also be in the shape of a rectangle, triangle or ellipse.

The light guide 200, the light distribution plate 210 and the optoelectronic device 100 have a planar design and a maximum height of 300 µm. The light guides 200 can be either connected directly to the light distribution plate 210 or optically coupled thereto, so that the light is distributed as uniformly as possible in the plane of the light distribution plate 210.

In an embodiment that is not shown, the longitudinal light guides 200 are integrated directly in the light distribution plate 210. In another embodiment that is not shown, the light is coupled through the optoelectronic device 100 into the light guide 200 without conversion. Conversion does not take place in the optoelectronic device 100 but takes place either in the region of the light guide 200 or even not until thereafter in the region of the light distribution plate 210, for instance by coating the light guide 200 or the light distribution plate 210 with a conversion material.

In another embodiment that is not shown, the light distribution plate 210 protrudes directly into the opening 61 of the optoelectronic device 100. The light generated in the optoelectronic device 100 is thus transmitted directly onto the light distribution plate 210. The longitudinal light guide 200 can hence be dispensed with. In this case, the light distribution plate 210 forms with the optoelectronic device 100 a self-contained back-lighting unit.

In the embodiments shown in FIGS. 9-13, the light guide 200 is not inserted into the side of the optoelectronic device 100 but from a top face of the device. In these embodiments, the device comprises an opening on the opposite face from the contact surfaces, for instance in the cover element (not shown), or in the form of the opening running vertically through the frame element 60 which, in the embodiments shown in FIGS. 9-13, forms the housing element 40 in the sense of the present application.

Figure 9:
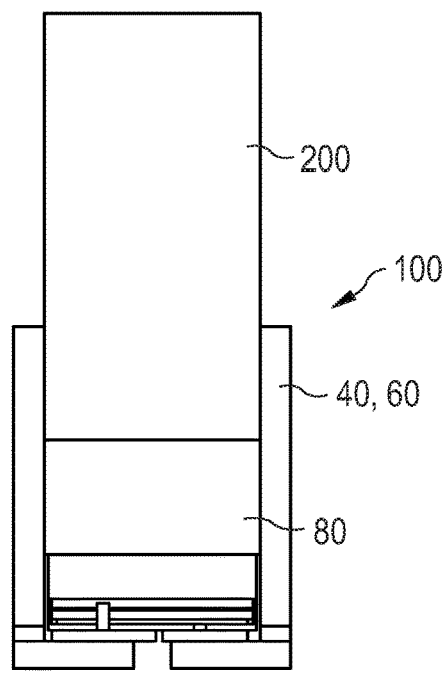
FIGS. 9 to 13 show further exemplified embodiments of an optoelectronic device in a schematic sectional view.
Figure 10:
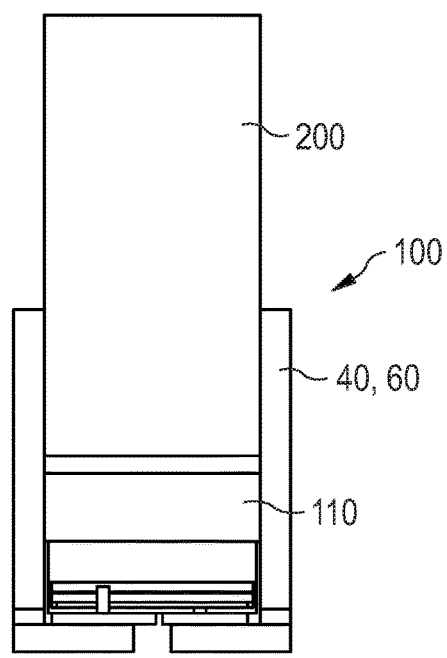
Figure 11:
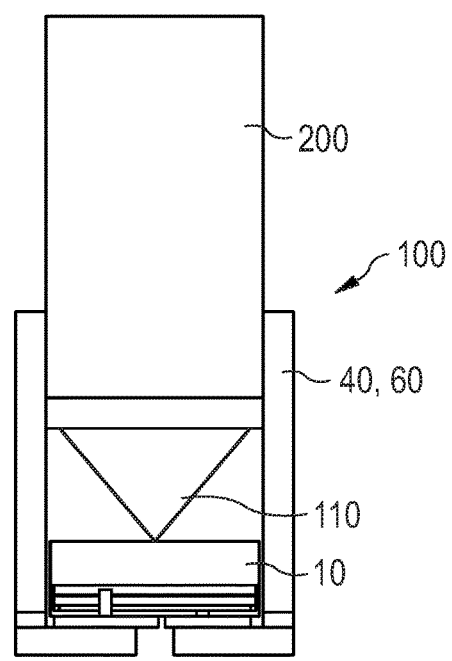

The embodiment shown in FIG. 9, like the embodiment of FIG. 1, comprises a conversion element 80. In the embodiment of FIG. 10, this is replaced by an optical element 110 made of glass. The optical element 110 is used to couple the light generated in the optoelectronic device 100 into the light guide element 200 as far as possible without significant losses. This can be achieved by suitable adjustments to the refractive index, a suitable spacing of the optical element 110 from the light guide element 200 (see FIG. 10) or by suitable geometric design of the optical element 110, for instance by a cross-section that tapers towards the semiconductor chip 10 (see FIG. 11).

Figure 12:
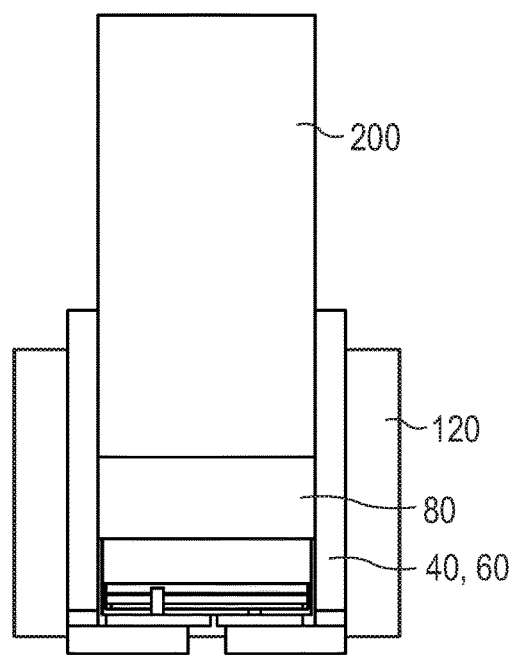

The embodiment shown in FIG. 12 comprises a potting body 120, for example made of epoxy, in which scattering particles of titanium oxide are optionally embedded, which potting body envelopes the frame element 40 and parts of the light guide element 200. The potting body 120 increases the mechanical strength of the bond between optoelectronic device 100 and light guide element 200.

Figure 13:
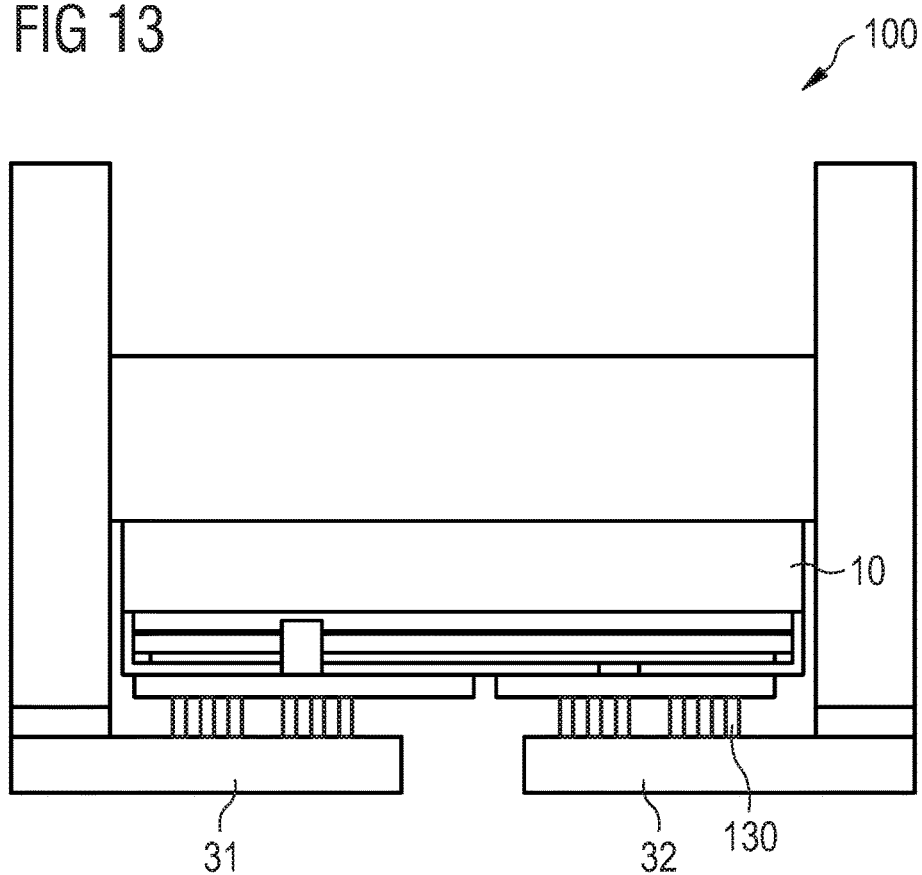

The embodiment shown in FIG. 13 comprises metal patterns 130, which are galvanically grown on the two contact surfaces 31, 32, make both a mechanical bond and an electrical connection to the semiconductor chip 10 and serve to reduce mechanical stresses when the temperature of the device 100 rises. The metal patterns 130 have a height of about 10 µm and a diameter (in the lateral direction) of approximately 50 µm, for example.

The invention is not restricted by the description based on the exemplified embodiments. Instead, the invention includes every novel feature and every novel combination of features, which in particular includes every combination of features in the claims, even if this feature or combination is not itself explicitly mentioned in the claims or the exemplified embodiments.

The invention claimed is:

1. An optoelectronic device comprising:
   an optoelectronic semiconductor chip;
   a first contact surface and a second contact surface that is laterally offset and electrically isolated from said first contact surface;
   a housing element; and
   a conversion element,
   wherein
      the optoelectronic semiconductor chip has a semiconductor body that comprises a semiconductor layer sequence containing an active region that is provided for generating and/or receiving radiation and is arranged between a first semiconductor layer and a second semiconductor layer,
      the first contact surface is connected to the first semiconductor layer in an electrically conducting manner, and the second contact surface is connected to the second semiconductor layer in an electrically conducting manner, the first contact surface and the second contact surface each protrude laterally from the optoelectronic semiconductor chip, the housing element is attached to the first contact surface and to the second contact surface in regions in which the first contact surface and the second contact surface respectively protrude laterally from the optoelectronic semiconductor chip, the housing element encloses at least part of the optoelectronic semiconductor chip, and a surface of the housing element that faces the optoelectronic semiconductor chip is designed to be reflective at least in portions, at least one wall of the housing element comprises an opening, the opening in the wall of the housing element is designed to accommodate a separate light guide element, and the conversion element directly adjoins the opening, and at least part of the conversion element is arranged between the optoelectronic semiconductor chip and the opening.

2. The optoelectronic device according to claim 1, wherein at least part of the housing element is made of a reflective material or at least a portion of the surface of the housing element that faces the optoelectronic semiconductor chip is formed by a layer of reflective material.

3. The optoelectronic device according to claim 1, wherein the housing element comprises a metal or comprises a glass coated at least partially by a reflective material.

4. The optoelectronic device according to claim 1, wherein a circuit for protecting the optoelectronic semiconductor chip from electrostatic discharge is arranged in a wall of the housing element.

5. The optoelectronic device according to claim 1, wherein the opening is arranged in a side wall of the housing element or in an end-face wall of the housing element.

6. The optoelectronic device according to claim 1, wherein the optoelectronic device has a height of less than 500 μm.

7. The optoelectronic device according to claim 1, wherein the housing element comprises a frame element that at least partially encloses the optoelectronic semiconductor chip laterally.

8. The optoelectronic device according to claim 7, wherein the frame element exhibits singulation marks on its external side walls.

9. The optoelectronic device according to claim 1, wherein the semiconductor body comprises at least one recess, which extends through the second semiconductor layer and the active region into the first semiconductor layer, and which is filled at least partially with electrically conducting material.

10. A lighting unit comprising the optoelectronic device according to claim 1, wherein at least part of the light guide element is arranged in the at least one opening in the optoelectronic device.

11. A backlighting unit comprising the optoelectronic device according to claim 1, wherein at least part of the light guide element is arranged in the at least one opening in the optoelectronic device.

12. An optoelectronic device comprising:
an optoelectronic semiconductor chip;
a first contact surface and a second contact surface that is laterally offset and electrically isolated from said first contact surface;
a housing element made of metal or glass that has a reflective coating; and
a conversion element,
wherein
the optoelectronic semiconductor chip has a semiconductor body that comprises a semiconductor layer sequence containing an active region that is provided for generating and/or receiving radiation and is arranged between a first semiconductor layer and a second semiconductor layer, the first contact surface is connected to the first semiconductor layer in an electrically conducting manner, and the second contact surface is connected to the second semiconductor layer in an electrically conducting manner, the first contact surface and the second contact surface each protrude laterally from the optoelectronic semiconductor chip, the housing element is attached to the first contact surface and to the second contact surface in regions in which the first contact surface and the second contact surface respectively protrude laterally from the optoelectronic semiconductor chip, the housing element encloses at least part of the optoelectronic semiconductor chip, and a surface of the housing element that faces the optoelectronic semiconductor chip is designed to be reflective at least in portions, wherein the housing element comprises a frame element that at least partially encloses the optoelectronic semiconductor chip laterally, at least one wall of the housing element comprises an opening, the opening in the wall of the housing element is designed to accommodate a separate light guide element, and the conversion element directly adjoins the opening, and at least part of the conversion element is arranged between the optoelectronic semiconductor chip and the opening.

* * * * *